United States Patent
Shen et al.

(10) Patent No.: US 7,368,394 B2
(45) Date of Patent: May 6, 2008

(54) ETCH METHODS TO FORM ANISOTROPIC FEATURES FOR HIGH ASPECT RATIO APPLICATIONS

(75) Inventors: Meihua Shen, Fremont, CA (US); Uwe Leucke, Dresden (DE); Guangxiang Jin, San Jose, CA (US); Xikun Wang, Sunnyvale, CA (US); Wei Liu, San Jose, CA (US); Scott Williams, Belmont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/363,834

(22) Filed: Feb. 27, 2006

(65) Prior Publication Data

US 2007/0199922 A1   Aug. 30, 2007

(51) Int. Cl.
*H01L 21/461* (2006.01)
*H01L 21/302* (2006.01)
(52) U.S. Cl. .................. 438/722; 216/76; 438/706; 438/710; 438/718; 438/736
(58) Field of Classification Search ................. 438/722
See application file for complete search history.

(56) References Cited

U.S. PATENT DOCUMENTS

| | | |
|---|---|---|
| 5,071,714 A | 12/1991 | Rodbell et al. |
| 5,188,979 A | 2/1993 | Filipiak |
| 5,337,207 A | 8/1994 | Jones et al. |
| 5,356,833 A | 10/1994 | Maniar et al. |
| 5,801,101 A | 9/1998 | Miyoshi et al. |
| 6,001,706 A * | 12/1999 | Tan et al. .................. 438/424 |
| 6,148,072 A | 11/2000 | Huang |
| 6,242,350 B1 | 6/2001 | Tao et al. |
| 6,270,568 B1 | 8/2001 | Droopad et al. |

(Continued)

FOREIGN PATENT DOCUMENTS

WO    WO 01/51072 A2    7/2001

(Continued)

OTHER PUBLICATIONS

Zhoa (Direct CMP for STI; Lam Research Corp.; Jun. 1, 2001; Semiconductor International).*

(Continued)

*Primary Examiner*—Shamim Ahmed
*Assistant Examiner*—Patricia A George
(74) *Attorney, Agent, or Firm*—Patterson & Sheridan, LLP

(57) ABSTRACT

Methods for forming anisotropic features for high aspect ratio application in etch process are provided in the present invention. The methods described herein advantageously facilitates profile and dimension control of features with high aspect ratios through a sidewall passivation management scheme. In one embodiment, sidewall passivations are managed by selectively forming an oxidation passivation layer on the sidewall and/or bottom of etched layers. In another embodiment, sidewall passivation is managed by periodically clearing the overburden redeposition layer to preserve an even and uniform passivation layer thereon. The even and uniform passivation allows the features with high aspect ratios to be incrementally etched in a manner that pertains a desired depth and vertical profile of critical dimension in both high and low feature density regions on the substrate without generating defects and/or overetching the underneath layers.

20 Claims, 10 Drawing Sheets

U.S. PATENT DOCUMENTS

| | | |
|---|---|---|
| 6,274,500 B1 | 8/2001 | Xuechun et al. |
| 6,297,095 B1 | 10/2001 | Muralidhar et al. |
| 6,300,202 B1 | 10/2001 | Hobbs et al. |
| 6,319,730 B1 | 11/2001 | Ramdani et al. |
| 6,326,261 B1 | 12/2001 | Tsang et al. |
| 6,328,905 B1 | 12/2001 | Lebowitz et al. |
| 6,348,386 B1 | 2/2002 | Gilmer |
| 6,479,395 B1 | 11/2002 | Smith et al. |
| 6,528,386 B1 | 3/2003 | Summerfelt et al. |
| 6,692,903 B2 * | 2/2004 | Chen et al. ................. 430/329 |
| 6,897,155 B2 | 5/2005 | Kumar et al. |
| 2003/0032237 A1 | 2/2003 | Clevenger et al. |
| 2003/0036241 A1 | 2/2003 | Tews |

FOREIGN PATENT DOCUMENTS

| | | |
|---|---|---|
| WO | WO 01/97257 A2 | 12/2001 |

OTHER PUBLICATIONS

Vitale et al. (Reduction of silicon recess caused . . . ; Texas instruments; Journal of Vacuum Science & technology B: Microelectronics and Nanometer Structures; Sep. 2003; vol. 1, Issue 5, pp. 2205-2211).*

Accuratus (material properties; printed Oct. 2002; http://www.accuratus.com/alumox.html.).*

Blauw, et al "Advanced Time-Multiplexed Plasma Etching of High Aspect Ratio Silicon Structure", Journal of Vacuum Society Technology, B 20(6), Nov./Dec. 2002.

* cited by examiner

ETCH METHODS TO FORM ANISOTROPIC FEATURES FOR HIGH ASPECT RATIO APPLICATIONS

CROSS-REFERENCE TO RELATED APPLICATIONS

This application is related to U.S. patent application Ser. No. 11/363,789, filed Feb. 27, 2006 entitled "Etch Methods to Form Anisotropic Features for High Aspect Ratio Applications" by Leucke, et al. which is herein incorporated by reference in its entirety.

BACKGROUND OF THE INVENTION

1. Field of the Invention

The present invention generally relates to methods for forming anisotropic features for high aspect ratio applications. More specifically, the present invention generally relates to methods of forming anisotropic features for high aspect ratio applications by an etch process in semiconductor manufacture.

2. Description of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of gate pattern is important to VLSI and ULSI success and to the continued effort to increase circuit density and quality of individual substrates and die.

As the feature sizes have become smaller, the aspect ratio, or the ratio between the depth of the feature and the width of the feature has steadily increased, such that manufacturing processes are being required to etch materials into features having aspect ratios of from about 50:1 to about 100:1 or even greater. Traditionally, features having aspect ratios of about 10:1 or so were produced by anisotropic etching the dielectric layers to a predetermined depth and width. However, when forming higher aspect ratio features, anisotropic etching using conventional sidewall passivation techniques, has become increasingly harder to obtain, thereby resulting in the features having uniform spacing and/or having double or multiple sloped profiles, thus losing the critical dimensions of the features.

Moreover, redeposition or build-up of passivation layers generated during the etching process on the top or sidewall of the features may block the opening defined in a mask. As the mask opening and/or opening of the etching features are narrowed or sealed by the accumulated redeposition layer, the reactive etchants are blocked from penetrating into the opening, thereby limiting the aspect ratio that may be obtained. As such, failure to sufficiently etch the features results in inability to obtain the desired aspect ratio of the features.

Another problem in etching features with high aspect ratio is the occurrence of a microloading effect, which is a measure of the variation in etch dimensions between regions of high and low feature density. The low feature density regions (e.g., isolated regions) receive more reactive etchants per surface area compared to the high feature density regions (e.g., dense regions) due to larger total openings of the surface areas, thereby resulting in a higher etching rate. The sidewall passivation generated from the etch by-products exhibited the similar pattern density dependence where more passivation is formed for the isolated features due to more by-products being generated in the region. The difference in reactants and the passivation per surface area between these two regions increase as feature density difference increase. As shown in FIG. 8A, due to different etch rates and by-products formation in high and low feature density regions, it is often observed that while the low feature density regions 802 have been etched and defined in a certain desired and controlled vertical dimension, the high feature density regions 804 are bowed and/or undercut 806 by the lateral attacking due to the insufficient sidewall passivation. In other processes, the low feature density regions 808 are described being etched at a faster rate with more passivation than the high feature density regions 810, as shown in FIG. 8B, resulting in a tapered top portion 812 on the sidewall of the etched layer 814. Therefore, insufficient sidewall protection associated with the different etch rates in high and low feature density regions with high aspect ratios often results in inability to hold critical dimension of the etch features and poor patterned transfer.

Yet another challenge associated with etching features with high aspect ratios is controlling the etch rate in feature formed through multiple layers and having different feature density. Here, each layer may etch at a different rate depending on feature density. As shown in FIG. 9, faster etch rates in the low feature density regions 902 often results in selectively overetching a layer 904 disposed below the upper etched layer 906, while slower etch rates in the dense feature regions 908 prevents a portion of the layer 910 from being completely etched. As the features move toward even higher aspect ratios, maintaining efficient etching rate over the low and high feature density regions without either underetching the upper layers or overetching into the lower layers has become increasingly difficult to control. The failure to form the features or patterns on the substrate as designed may result in unwanted defects, and further adversely affect subsequent process steps, ultimately degrading or disabling the performance of the final integrated circuit structure.

Therefore, there is a need in the art for improved methods to etch features with high aspect ratios.

SUMMARY OF THE INVENTION

Methods for forming anisotropic features for high aspect ratio application in etch process are provided in the present invention. The methods described herein advantageously facilitates profile and dimension control of features with high aspect ratios through a sidewall passivation management scheme. In one embodiment, sidewall passivations are managed by selectively forming an oxidation passivation layer on the sidewall and/or bottom of etched layers. In another embodiment, sidewall passivation is managed by periodically clearing the overburden redeposition layer to preserve an even and uniform passivation layer thereon. The even and uniform passivation allows the features with high aspect ratios to be incrementally etched in a manner that pertains a desired depth and vertical profile of critical dimension in both high and low feature density regions on the substrate without generating defects and/or overetching the underneath layers.

In one embodiment, the method includes placing a substrate having a layer disposed thereon in an etch chamber, etching the layer through an opening formed in a mask layer using a first gas mixture to define a first portion of a feature, clearing the opening by in-situ etching a redeposition layer formed during etching using a second gas mixture, and etching the layer through the cleared opening.

In another embodiment, the method includes placing a substrate having a layer disposed thereon in an etch chamber, etching at least a portion of the layer on the substrate, forming an oxidation layer on the etched layer, and etching the exposed portion of the etched layer unprotected by the oxidation layer in the etch chamber.

In yet another embodiment, the method includes placing a substrate having a film stack comprising a first layer and a second layer in an etch chamber, etching the film stack to expose the first and the second layer in the etch chamber, forming an oxidation layer on the first layer, and etching the second layer in the etch chamber.

In yet another embodiment, the method includes placing a substrate having a film stack comprising a first layer and a second layer in an etch chamber, etching the film stack in the etch chamber to expose the first layer and the second layer using a first gas mixture, etching a redeposition layer formed during etching using a second gas mixture, forming an oxidation layer on the first layer by exposing the substrate to an oxygen gas containing environment, and etching the second layer unprotected by the oxidation layer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The invention generally relates to methods for forming anisotropic features for high aspect ratio application by etch process. In one embodiment, the method includes plasma etching redeposition material deposited on the top and/or sidewall of features with high aspect ratios. In another embodiment, the method includes forming a protective oxidation layer on a portion of an etched region on a substrate surface. The etching process may be performed in one or more chambers integrated in a cluster tool.

The etch process described herein may be performed in any plasma etch chamber, for example, a HART etch reactor, a HART TS etch reactor, a Decoupled Plasma Source (DPS), DPS-II, or DPS Plus, or DPS DT etch reactor of a CENTURA® etch system, all of which are available from Applied Materials, Inc. of Santa Clara, Calif. Plasma etch chambers from other manufacturers may also be utilized. The DPS reactor uses a 13.56 MHz inductive plasma source to generate and sustain a high density plasma and a 13.56 MHz source bias power to bias a wafer. The decoupled nature of the plasma and bias sources allows independent control of ion energy and ion density. The DPS reactor provides a wide process window over changes in source and bias power, pressure, and etchant gas chemistries and uses an endpoint system to determine an end of the processing.

Figure 1:
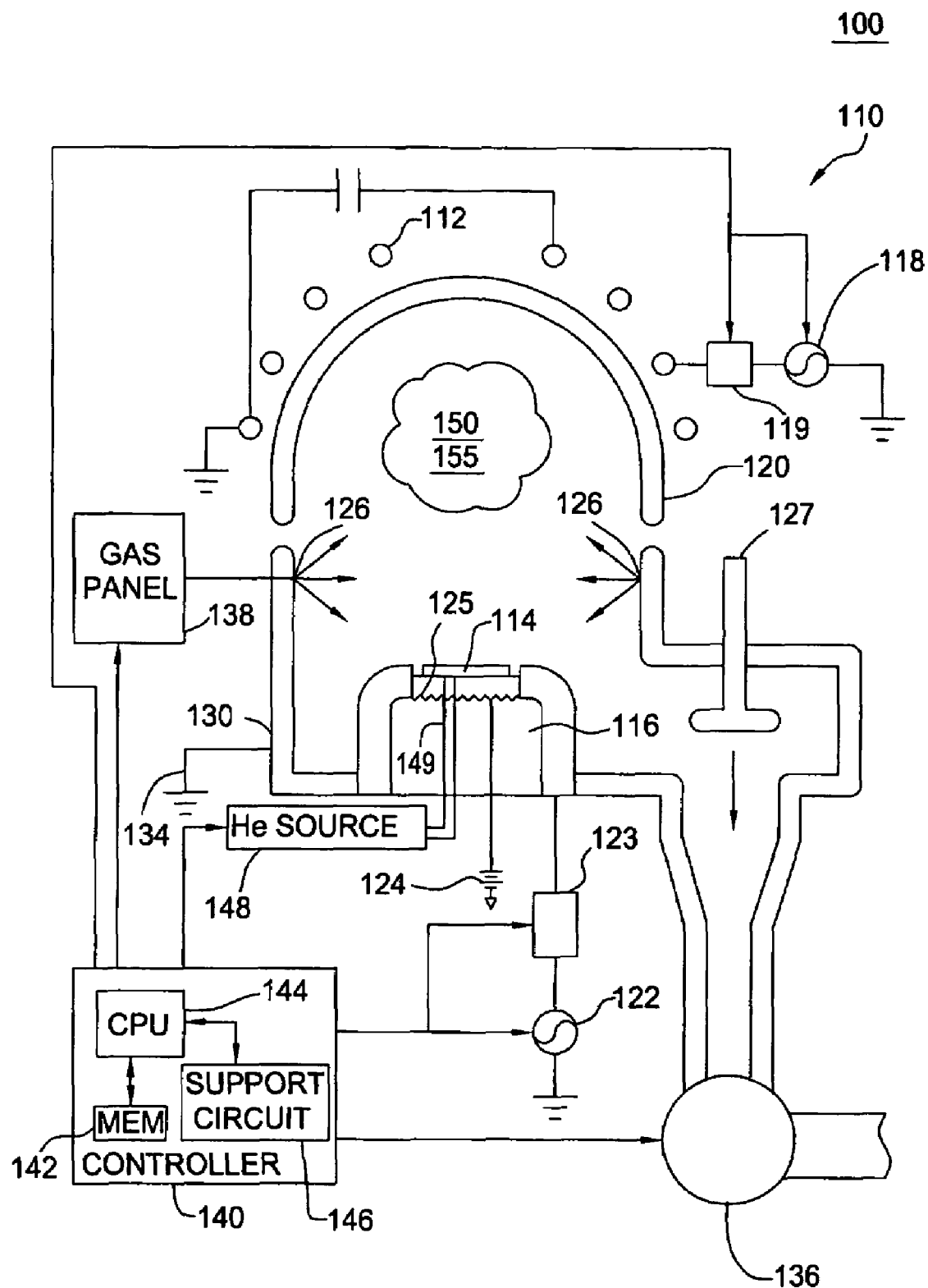
FIG. 1 is a schematic diagram of a plasma processing apparatus used in performing the etching processed according to one embodiment of the invention.

FIG. 1 depicts a schematic diagram of one embodiment of an etch process chamber 100. The chamber 100 includes a conductive chamber wall 130 that supports a dielectric dome-shaped ceiling (referred hereinafter as the dome 120). Other chambers may have other types of ceilings (e.g., a flat ceiling). The wall 130 is connected to an electrical ground 134.

At least one inductive coil antenna segment 112 is coupled to a radio-frequency (RF) source 118 through a matching network 119. The antenna segment 112 is positioned exterior to a dome 120 and is utilized to maintain a plasma formed from process gases within the chamber. In one embodiment, the source RF power applied to the inductive coil antenna 112 is in a range between about 0 Watts to about 2500 Watts at a frequency between about 50 kHz and about 13.56 MHz. In another embodiment, the source RF power applied to the inductive coil antenna 112 is in a range between about 200 Watts to about 800 Watts, such as at about 400 Watts.

The process chamber 100 also includes a substrate support pedestal 116 (biasing element) that is coupled to a second (biasing) RF source 122 that is generally capable of producing an RF signal to generate a bias power about 1500 Watts or less (e.g., no bias power) at a frequency of approximately 13.56 MHz. The biasing source 122 is coupled to the substrate support pedestal 116 through a matching network 123. The bias power applied to the substrate support pedestal 116 may be DC or RF.

In operation, a substrate 114 is placed on the substrate support pedestal 1146 and is retained thereon by conventional techniques, such as electrostatic chucking or mechanical clamping of the substrate 114. Gaseous components are supplied from a gas panel 138 to the process chamber 100 through entry ports 126 to form a gaseous mixture 150. A plasma, formed from the mixture 150, is maintained in the process chamber 100 by applying RF power from the RF sources 118 and 122, respectively, to the antenna 112 and the substrate support pedestal 116. The pressure within the interior of the etch chamber 100 is controlled using a throttle valve 127 situated between the chamber 100 and a vacuum pump 136. The temperature at the surface of the chamber walls 130 is controlled using liquid-containing conduits (not shown) that are located in the walls 130 of the chamber 100.

The temperature of the substrate 114 is controlled by stabilizing the temperature of the support pedestal 116 and flowing a heat transfer gas from source 148 via conduit 149 to channels formed by the back of the substrate 114 and grooves (not shown) on the pedestal surface. Helium gas may be used as the heat transfer gas to facilitate heat transfer between the substrate support pedestal 116 and the substrate 114. During the etch process, the substrate 114 is heated by a resistive heater 125 disposed within the substrate support pedestal 116 to a steady state temperature via a DC power source 124. Helium disposed between the pedestal 116 and substrate 114 facilitates uniform heating of the substrate 114. Using thermal control of both the dome 120 and the substrate support pedestal 116, the substrate 114 is maintained at a temperature of between about 100 degrees Celsius and about 500 degrees Celsius.

Those skilled in the art will understand that other forms of etch chambers may be used to practice the invention. For example, chambers with remote plasma sources, microwave plasma chambers, electron cyclotron resonance (ECR) plasma chambers, and the like may be utilized to practice the invention.

A controller 140, including a central processing unit (CPU) 144, a memory 142, and support circuits 146 for the CPU 144 is coupled to the various components of the DPS etch process chamber 100 to facilitate control of the etch process. To facilitate control of the chamber as described above, the CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. An etching process, such as described herein, is generally stored in the memory 142 as a software routine. The software routine may also be stored and/or executed by a second CPU (not shown) that is remotely located from the hardware being controlled by the CPU 144.

Figure 2:
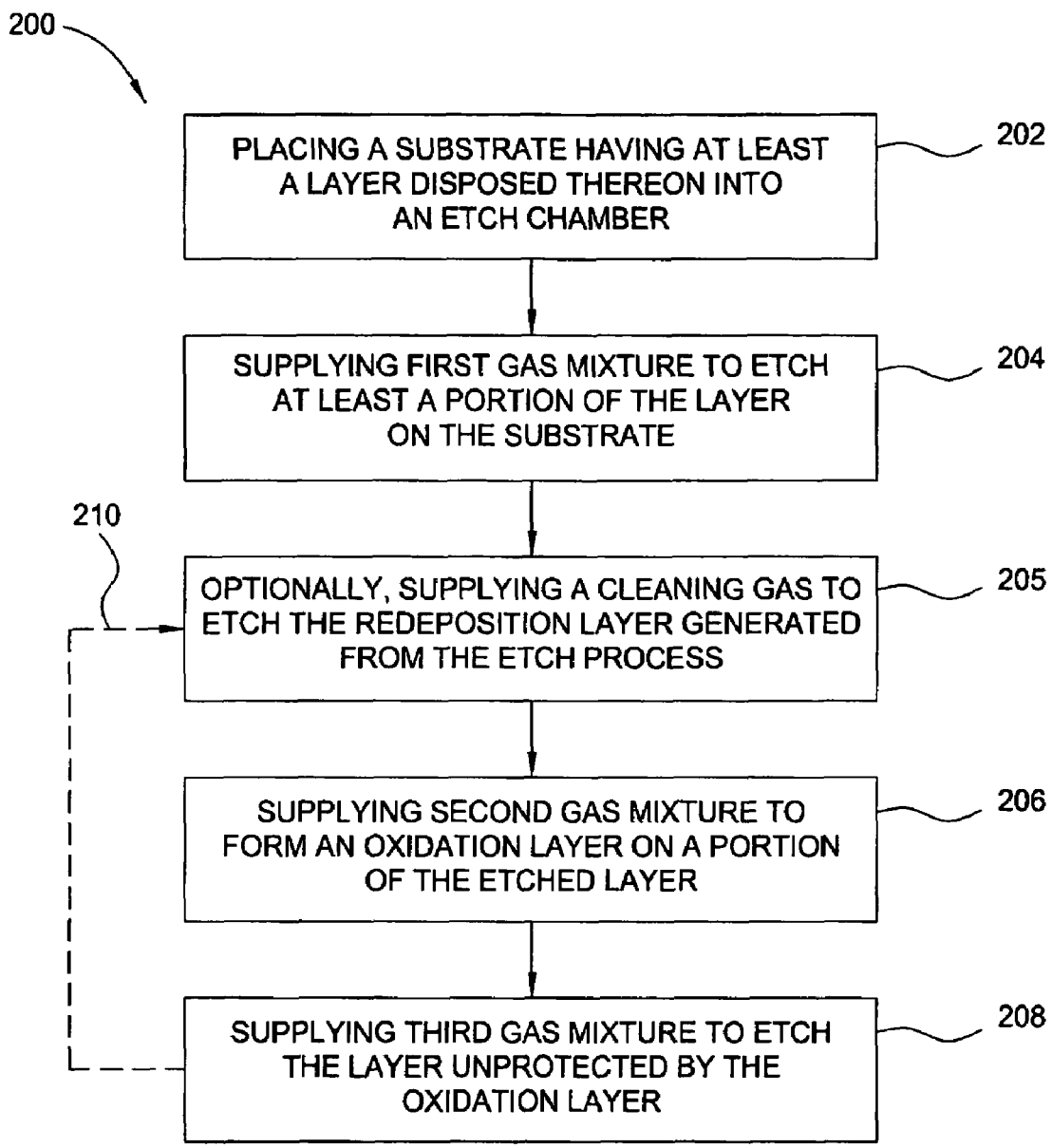
FIG. 2 is a process flow diagram illustrating a method incorporating one embodiment of the invention.

FIG. 2 is a flow diagram of one embodiment of an etch process 200 that may be practiced in the chamber 100 or other suitable processing chamber. FIGS. 3A-3D are schematic cross-sectional views of a portion of a composite substrate corresponding to various stages of the process 200. Although the process 200 is illustrated for forming a gate structure in FIGS. 3A-3D, the process 200 may be beneficially utilized to etch other structures.

The process 200 begins at step 200 by transferring (i.e., providing) a substrate 114 to an etch process chamber. In the embodiment depicted in FIG. 3A, the substrate 114 has a film stack 300 suitable for fabricating a gate structure. The substrate 114 may be any one of semiconductor substrates, silicon wafers, glass substrates and the like. The layers that comprise the film stack 300 may be formed using one or more suitable conventional deposition techniques, such as atomic layer deposition (ALD), physical vapor deposition (PVD), chemical vapor deposition (CVD), plasma enhanced CVD (PECVD), and the like. The film stack 300 may be deposited using the respective processing modules of CENTURA®, PRODUCER®, ENDURA® and other semiconductor wafer processing systems available from Applied Materials, Inc. of Santa Clara, Calif., among other module manufacturers. In one embodiment, the film stack 300 includes a gate electrode layer 314 and a gate dielectric layer 302. At least a portion of the gate electrode layer 314 is exposed for etching. In the embodiment shown in FIG. 3, portions 318, 320 of the gate electrode layer 314 are exposed through one or more openings in a patterned mask 308.

In one embodiment, the gate electrode layer 314 may comprise a stack of a metal material 306 on top of a polysilicon material 304. The metal material 306 may be selected from a group of tungsten (W), tungsten nitride (WN), tungsten silicide (WSi), tungsten polysilicon (W/poly), tungsten alloy, tantalum (Ta), tantalum nitride (TaN), tantalum silicon nitride (TaSiN), titanium nitride (TiN), alone or the combination thereof.

Figure 3A:
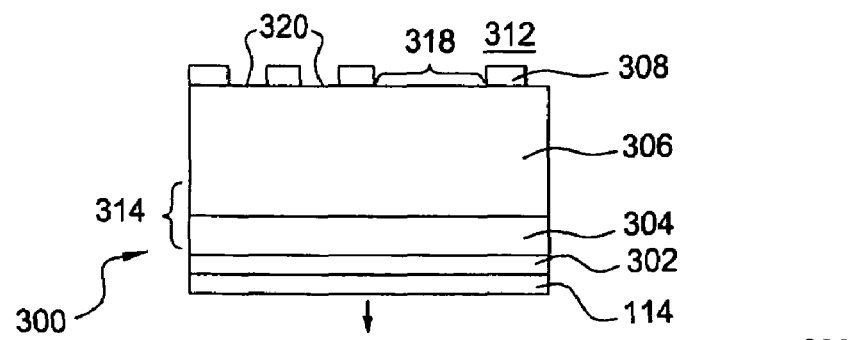
FIGS. 3A-3E are diagrams illustrating a cross-sectional view of a portion of a composite structure having a dense region and an isolated region.

In the exemplary embodiment of the FIG. 3A, the mask 308 may be a hard mask, photoresist mask or a combination thereof. The mask 308 may be used as an etch mask to form opening portions in dense regions 320 and in isolated regions 318 for etching both the gate electrode layer 314, and the gate dielectric layer 302 into predetermined features.

Figure 3B:
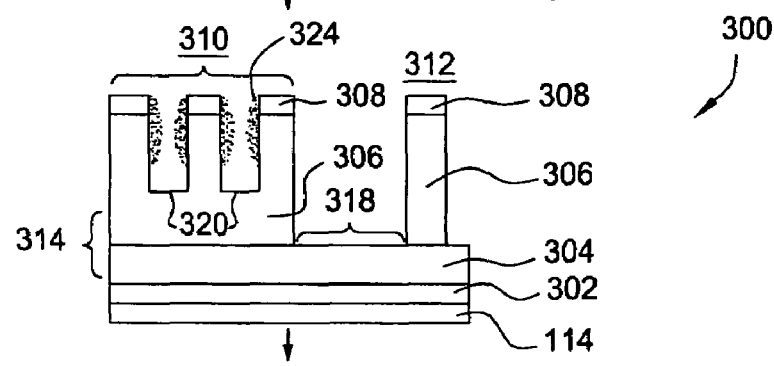

At step 204, a first gas mixture is supplied to the etch chamber to etch the substrate 114 placed therein. During etching, the layer 306 on the substrate 114 is etched and removed from the portions 318, 320, as shown in FIG. 3B, leaving the trench defined by the mask 308. After reaching an endpoint, at least a portion of the layer 306 has been removed on the substrate. The endpoint may be determined by any suitable method. For example, the endpoint may be determined by monitoring optical emissions, expiration of a predefined time period or by another indicator for determining that the layer to be etched has been sufficiently removed.

The first gas mixture may include any gas suitable for etching a metal containing gate electrode layer. In one embodiment, the first gas mixture may include, but not limited to, an oxygen gas accompanying with at least one of nitrogen gas ($N_2$), chlorine gas ($Cl_2$), nitrogen trifluoride ($NF_3$), sulfur hexafluoride gas ($SF_6$), carbon and fluorine containing gas, such as $CF_4$, $CHF_3$, $C_4F_8$ or among others, argon (Ar), helium (He), and the like.

Several process parameters are regulated while the first gas mixture supplied into the etch chamber. In one embodiment, the chamber pressure in the presence of the first gas mixture is regulated. In one exemplary embodiment, a process pressure in the etch chamber is regulated between about 2 mTorr to about 100 mTorr, for example, at about 10 mTorr. RF source power may be applied to maintain a plasma formed from the first process gas. For example, a power of about 100 Watts to about 1500 Watts may be applied to an inductively coupled antenna source to maintain a plasma inside the etch chamber. The first gas mixture may be flowed into the chamber at a rate between about 50 sccm to about 1000 sccm. A substrate temperature is maintained between about 30 degrees Celsius to about 500 degrees Celsius.

During etching, the by-products, such as silicon and carbon containing elements, formed during the etching of unmasked areas within the etch chamber may condense and accumulate on the sidewall or top of the mask layer 308 and etched layer 306, thereby forming a redeposition layer 324, as shown in FIG. 3B. As the redeposition layer 324 grows, the opening portion 320 of the trench may be closed or narrowed, thereby disrupting the etching process. As such, an optional step 205 of supplying a cleaning gas into the etch chamber to etch the redeposition layer 324 accumulated on the top or sidewall of the mask layer 308 and etched layer

306. The cleaning gas removes the redeposition layer 324, thereby reopening the patterned mask predefined thereof.

The cleaning gas may include a fluorine-containing gas. In one embodiment, the cleaning gas comprises nitrogen trifluoride ($NF_3$), sulfur hexafluoride gas ($SF_6$), tetrafluoromethane gas ($CF_4$). In another embodiment, the cleaning gas comprises carbon and fluorine containing gas includes $CHF_3$, $C_4F_8$, and the like. A carrier gas, such as argon (Ar), helium (He), and the like, may also be utilized to supply into the etch chamber during cleaning.

Referring back to FIG. 3B, the portions 320 in the dense regions 310 receive fewer etching species per surface area compared to the portions 318 in the isolated regions 312 due to larger total openings of the surface areas. The difference in reactant per surface area between these two regions increase as pattern density difference increases, thereby increasing the undesired microloading effect. The microloading effect is prevalent while etching substrates with high aspect ratios or densely packed features formed thereon. A relatively high amount of etching species is accumulated on the portions 318 in isolated regions 312, thereby resulting in a higher etching rate and, as such, the portions 318 exposed in the isolated regions 312 are etched at a much faster rate than dense regions 310. After the substrate has been etched for a predetermined period, the portions 318 of the layer in the isolated regions 312 have been removed while the portions 320 of the layer in the dense regions 310 still remain at least a portion to be etched due to the different etching rate occurred thereto.

Figure 3C:
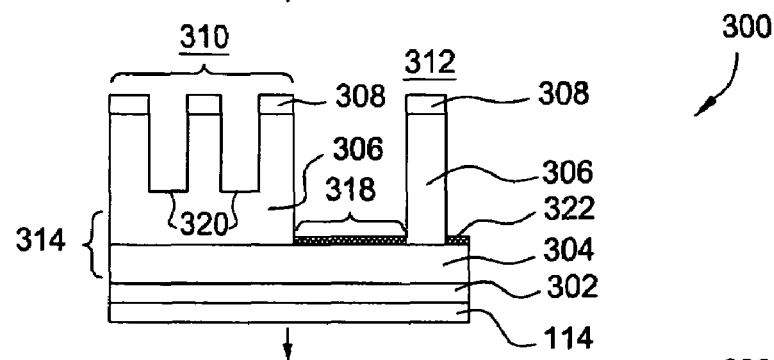

At step 206, an oxidation layer 322 may be deposited on the substrate 114, as shown in FIG. 3C. In one embodiment, a second gas or gas mixture is supplied to the etch chamber that includes an oxygen-containing gas. The oxygen-containing gas reacts with the portions 318 of the exposed underlying layer 304, e.g., a polysilicon layer to form the oxidation layer 322, such as $SiO_2$. The oxidation layer 322 formed thereon serves as a passivation layer to protect the underlying layer 304 from being attacked while removing the remaining portion of the layer 306 in the dense regions 310 defined by the mask layer 308. The portions 320 of the gate electrode layer 306 in dense regions 310 are less unlikely to form the oxidation layer as with the portions 318 exposed on the underlying polysilicon layer 304, due to the inactive characteristic of the material and insufficient contact with the oxygen species, thereby selectively oxidizing a portion of the substrate surface. As such, the oxidation layer 322 is substantially formed selectively on the portion 318 where the underlying layer 304 has been exposed and leaves the to-be-etched portions 320 of the layer 306 unprotected and available for further etching to remove the remaining portion 320 of the layer 306.

The oxidation layer described herein may be formed in various methods. In one embodiment, the oxidation layer may be formed in situ by supplying at least an oxygen-containing gas, e.g., $O_2$, $N_2O$, NO, CO, $CO_2$, and the like, into the etch chamber to react with the polysilicon surface. In another embodiment, the polysilicon layer 304 may be exposed to an environment containing at least oxygen gas or an oxygen-containing gas (i.e., transferring the substrate to a buffer chamber or transferring chamber) to form an oxidation layer thereon. In yet another embodiment, the substrate may be transferred to another process chamber or another tool providing at least oxygen gas or an oxygen-containing gases to form an oxidation layer on the surface of the substrate.

Several process parameters are regulated while the oxygen-containing gas supplied into the etch chamber. In one embodiment, the chamber pressure in the presence of the oxygen-containing gas inside the etch chamber is regulated. In one exemplary embodiment, a pressure of the oxygen-containing gas in the etch chamber is regulated between about 2 mTorr to about 150 mTorr, for example, between about 10 mTorr to about 100 mTorr. RF source power may be applied to maintain a plasma formed the second gas to oxidize at least a portion of the layer 304 on the substrate. For example, a power of about 200 Watts to about 1500 Watts may be applied to an inductively coupled antenna source to maintain a plasma inside the etch chamber. The oxygen-containing gas may be flowed at a rate between about 50 sccm to about 2000 sccm.

Figure 3D:
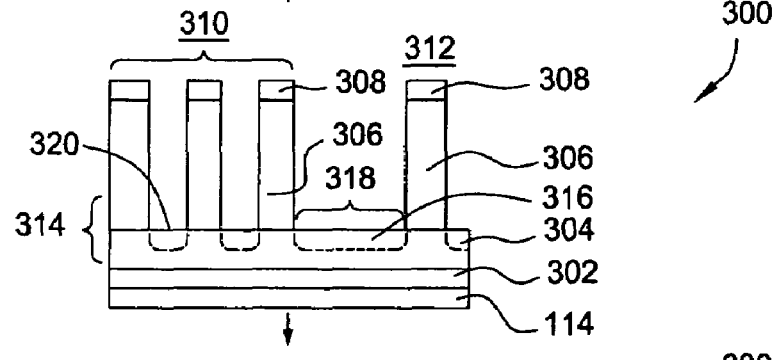
Figure 3E:
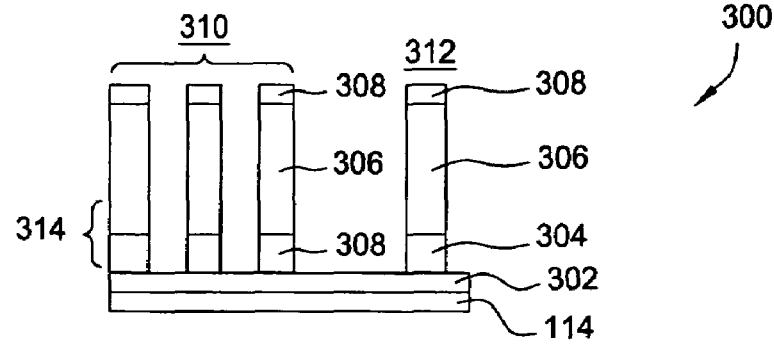

At step 208, a third gas mixture is supplied to the process chamber to further etch the remaining portion 320 of the layer 306 inside the process chamber, as shown in FIG. 3D. In one embodiment, the etch process may be terminated when the remaining portion 320 of the layer 306 in the dense regions 310 has been removed. In another embodiment, the etch process may be terminated by overetching into a portion 316 (shown in phantom) of the underlying layer 304. In yet another embodiment, the etching process may be terminated after the exposed plan surface of the underlying layer 304 has been removed and the patterned feature of the mask 308 has been successfully transferred to the film stack 300, as shown in FIG. 3E. In an optional embodiment, the steps 205, 206, 208 may be performed repeatedly, as indicated by loop 210 illustrated in FIG. 2, to incrementally remove the portions 320 of the layer 306 in the dense regions 310 until the portions 320 have been entirely removed, thereby exposing the gate dielectric layer 302.

The third gas mixture may be any suitable gas mixture for etching the remaining portion of the layer on the substrate. In one embodiment, the third gas mixture may be the same as the first gas mixture in the step 202 described above. In another embodiment, the third has mixture may be any suitable gas used for etching a silicon layer. In yet another embodiment, the third gas mixture may be selected from a group consisting of gas, such as $Cl_2$, HCl, HBr, $CF_4$, $CHF_3$, $NF_3$, $SF_6$, $O_2$, $N_2$, He or Ar among others.

Furthermore, the process parameters may be regulated while the third gas mixture supplied into the etch chamber. In one embodiment, a process pressure in the etch chamber is regulated between about 2 mTorr to about 100 mTorr, for example, at about 4 mTorr. RF source power may be applied to maintain a plasma formed from the first process gas to etch at least a portion of the layer 304 on the substrate. For example, a power of about 150 Watts to about 1500 Watts may be applied to an inductively coupled antenna source to maintain a plasma inside the etch chamber. The third gas mixture may be flowed at a rate between about 50 sccm to about 1000 sccm. A substrate temperature is maintained within a temperature range of about 20 degrees Celsius to about 80 degrees Celsius.

The method for etching a substrate described herein may be utilized to etch a substrate with different film layers and structures. In another exemplary embodiment, illustrated in FIGS. 4A-4G, a substrate is etched by using the another embodiment of the method 200 of FIG. 2. FIGS. 4A-4G are schematic cross-sectional views of a portion of a composite substrate corresponding to the process 200 for etching a composite substrate. Although the process 200 is illustrated for forming a gate structure in FIGS. 4A-4G, the process 200 may be beneficially utilized to etch other structures.

Figure 4A:
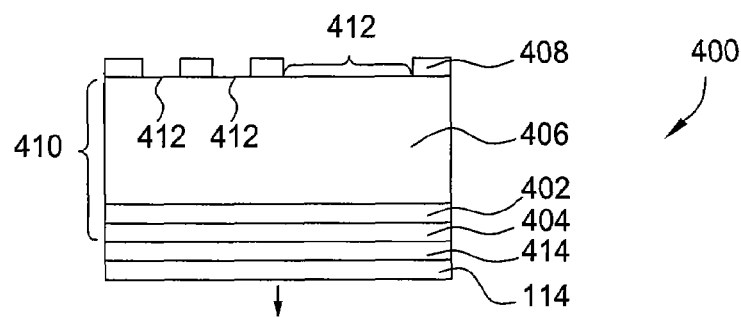
FIGS. 4A-4G are diagrams illustrating a cross-sectional view of a portion of a composite structure having a layer containing at least a high-k material.

The method 200 begins at step 202 where a substrate is provided and transferred to an etch process chamber. The substrate 114, as shown in FIG. 4A, contains a layer containing a high-k dielectric layer disposed thereon. In one embodiment, the substrate 114 includes a film stack 410, within which a structure, e.g., a gate, is to be formed thereon. The film stack 410 includes at least one or more layers 404, 406 sandwiching a high dielectric constant material layer 402 (high-k materials have dielectric constants greater than 4.0). The film stack 410 may be disposed on a dielectric layer 414, e.g., a gate dielectric layer or directly on the substrate 114. A mask 408, e.g., a hard mask, photoresist mask, or the combination thereof, may be used as an etch mask exposing portions 412 of the film stack 410 for etching features thereon. The substrate 114 may be any semiconductor substrates, silicon wafers, glass substrates and the like. It is contemplated that the sandwiched dielectric layer 402 may be any suitable dielectric layers utilized to form a structure on a substrate. Suitable examples of dielectric layers include, but not limited to, an oxide layer, a nitrogen layer, a composite of oxide and nitrogen layer, at least one or more oxide layers sandwiching a nitrogen layer, and among others.

In the embodiment depicted in FIG. 4, the high-k material layer 402 may include materials having dielectric constant greater than 4.0, examples of which include hafnium dioxide ($HfO_2$), zirconium dioxide ($ZrO_2$), hafnium silicon oxide ($HfSiO_2$), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

A layer 406 above the high-K material layer 402 may include one or more layers. In one embodiment, the layer 406 includes a metal material for the gate electrode, including tungsten (W), tungsten silicide (WSi), tungsten polysilicon (W/poly), tungsten alloy, tantalum (Ta), tantalum nitride (TaN), tantalum silicon nitride (TaSiN), and titanium nitride (TiN), among others. Alternatively, the layer 406 may also be or include a polysilicon layer. The layer 404, e.g., a polysilicon layer or an oxide layer, is optionally disposed under the high-k material layer 402 if desired for the structure being fabricated from the stack 410.

Figure 4B:
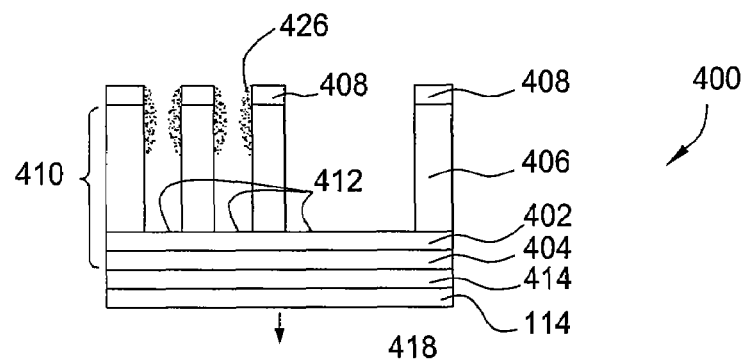

At step 204, a first gas mixture is supplied to the etch chamber to etch the film stack 410, as shown in FIG. 4B. In step 204, the portions 412 of the layer 406 is etched through openings defined by the mask 408 to form a trench in the stack 410.

In one embodiment, the first gas mixture includes a halogen-containing gas and does not include an oxygen-containing gas. The halogen-containing gas may be a chlorine containing gas, including, but not limited to, at least one of chlorine gas ($Cl_2$), boron chloride ($BCl_3$), and hydrogen chloride (HCl), among others. Alternatively, both chlorine gas ($Cl_2$) and boron chloride ($BCl_3$) can be included in the first gas mixture. The type of halogen gas (e.g., $Cl_2$, $BCl_3$ or both) is selected to efficiently remove the metal (e.g., hafnium, zirconium, etc.) from the layer 406.

In another embodiment, the first gas mixture used in step 204 may further include a reducing agent with or without oxygen-containing gas. Suitable reducing agents include, but are not limited to, hydrocarbon gases, such as carbon monoxide (CO), oxygen gas ($O_2$), methane ($CH_4$), ethane ($C_2H_6$), ethylene ($C_2H_4$), and combinations thereof, among others. In one alternative embodiment, the hydrocarbon (e.g., methane) is selected to serve as a polymerizing gas that combines with by-products produced during the etch process. The methane is used to suppress etching of silicon material, such that a high etch selectivity for high-K dielectric materials (e.g., $HfO_2$ or $HfSiO_2$) to silicon materials is obtained. Additionally, the first gas mixture may further include one or more additional gases, such as helium (He), argon (Ar), nitrogen ($N_2$), among others.

Process parameters may be regulated while the first gas mixture is supplied to the etch chamber. In one embodiment, the chamber pressure in the presence of the first gas mixture inside the etch chamber is regulated between about 2 mTorr to about 100 mTorr, for example, at about 10 mTorr. A substrate bias power may be applied to the substrate support pedestal at a power between about 0 and about 800 Watts. RF source power may be applied to maintain a plasma formed from the first process gas to etch at least a portion of the layer 406. For example, a power of about 0 Watts to about 3000 Watts may be applied to an inductively coupled antenna source to maintain the plasma inside the etch chamber. A substrate temperature is maintained within a temperature range of about 30 degrees Celsius to about 500 degrees Celsius.

At an optional step 205, a cleaning gas may be supplied to etch a redeposition layer 426 deposited during the etching step 204. The redeposition layer 426 may be formed during etching of unmasked releasing by-products, such as silicon and carbon containing elements, within the etch chamber. The by-products may condense and accumulate on the sidewall or top of the mask layer 408 and etched layer 406, thereby forming a redeposition layer 426, as shown in FIG. 4B. As the redeposition layer 426 grows, the opening portion 412 of the trench may be narrowed and/or sealed, thereby disrupting the termination of the trench etching process. As such, a cleaning gas may be supplied into the etch chamber to etch the redeposition layer 426 to remove the polymer accumulation, thereby reopening the patterned mask to allow etching to continue without adverse effects to critical dimensions and/or trench sidewall profile/angle.

The cleaning gas may include a fluorine-containing gas. In one embodiment, the cleaning gas comprises at least one fluorine-containing gas, such as nitrogen trifluoride ($NF_3$), sulfur hexafluoride gas ($SF_6$), tetrafluoromethane gas ($CF_4$) and the like. In another embodiment, the cleaning gas comprises carbon and fluorine containing gas includes $CHF_3$, $C_4F_8$, and the like. An inserting gas, such as argon (Ar), helium (He), and the like, may additionally be provided in the cleaning gas.

In conventional processes, insufficient sidewall passivation of the etched layer with high aspect ratio may be observed during the etching process. Without enough sidewall passivation, lateral as well as vertical etching may occur concurrently, resulting in large changes in the predetermined dimensions of a feature or eroding the corners of a feature, e.g., rounded corners, as a result of an etching process. Such changes are referred to as critical dimension (CD) bias.

Figure 4C:
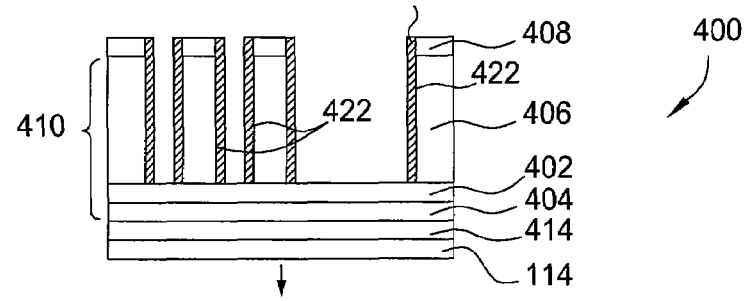

To prevent CD bias, an oxidation layer 418 is deposited at step 206. The oxidation layer 418 may be applied by supplying a second gas mixture having an oxygen-containing gas into the etch chamber to form the oxidation layer 418 on sidewalls 422 of the etched layer 406 on the substrate, as shown in FIG. 4C. In one embodiment, the exposed sidewall 422 of the layer 406 reacts with the oxygen gas supplied into the process chamber to form the oxidation layer 418 as a $SiO_x$ layer. The oxidation layer 418 serves as a passivation layer to protect the sidewall 422 of the layer 406 from lateral attack in following etching steps.

The oxidation layer 418 may be formed in various methods. In one embodiment, the oxidation layer 418 may be formed in-situ by supplying at least an oxygen-containing gas, e.g., $O_2$, $N_2O$, NO, CO and $CO_2$, among others, into the etch chamber to react with the substrate. In another embodiment, the etched layer 406 may be exposed to an environment containing an oxygen gas and/or oxygen-containing gas to form an oxidation layer thereon. In yet another embodiment, the oxidation layer is formed during transfer between tools by exposure to atmospheric conditions outside the vacuum environment of the tool by transferring the substrate to a buffer chamber or transferring chamber.

Figure 4D:
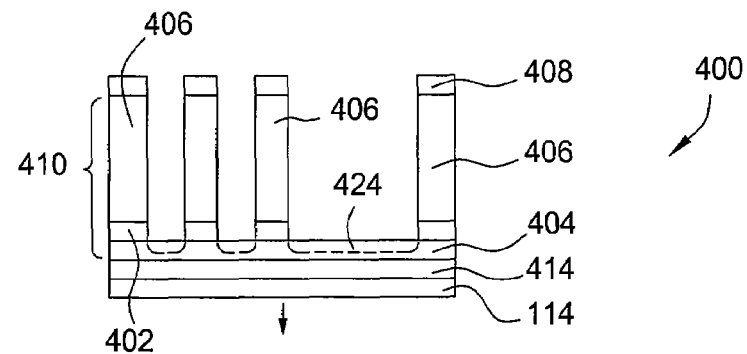

At step 208, a third gas mixture is supplied into the process chamber to etch the high-k material layer 402, as shown in FIG. 4D. In one embodiment, a portion of the layer 406 remaining after step 204 is etched along with the layer 402. The etching process at step 208 is substantially vertical. In one embodiment, the etching process at step 208 may be ended while the high-k material 402 has been entirely removed. In another embodiment, the etching process may include overetching the substrate to remove a portion 424 of the underlying layer 404 disposed below the high-k material layer 402.

The redeposition layer 426 may be redeposited during the subsequent etching process of step 208, and the oxidation layer 418 may be consumed during the etching process. As such, the steps 205, 206, 208 may optionally be performed cyclically to incrementally etch the layer 402. Incremental etching with repetitive removal of redeposition layers 426 and deposition of oxidation layers 418 improves trench verticality and enhances mask to trench CD transfer by reopening the patterned mask and maintaining an oxidation layer during the feature etching of the layer 402.

Figure 4E:
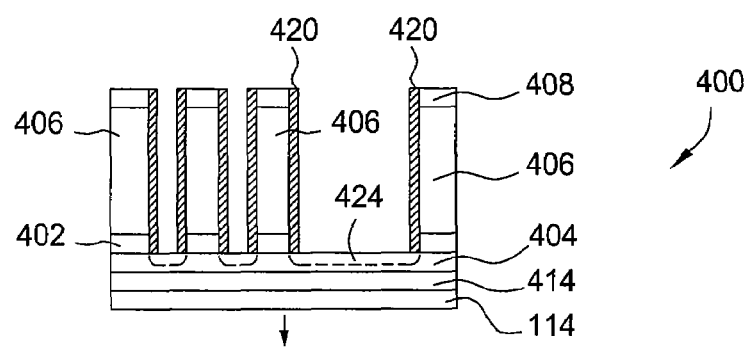

In an alternative embodiment, a second oxidation layer 420 may be applied to the sidewall 422 of the etched layers 406, 402 after the first oxidation layer 418 is consumed by providing the second gas mixture into the etch chamber again to further prevent the layer from lateral etching during the subsequent etching process, as shown in FIG. 4E.

Figure 4F:
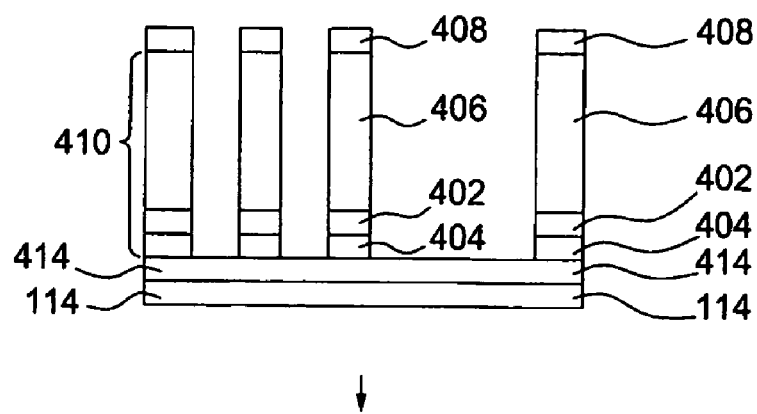

Subsequent the optional deposition of the second oxidation layer 420, a third gas mixture may be supplied into the process chamber to etch the layer 404, as shown in FIG. 4F. The third gas mixture gas may be any suitable gas used to remove the layer 404. In one embodiment, the third gas mixture may be the same as the first gas mixture in step 204. In another embodiment, the third gas mixture may be selected from a group consisting of HBr, $Cl_2$, HCl, $CF_4$, $CHF_3$, $NF_3$, $SF_6$, $N_2$, $O_2$, He, Ar and among others.

Process parameters may be regulated during etching of the layer 404. for example, a process pressure in the etch chamber is regulated between about 2 mTorr to about 100 mTorr, such as at about 20 mTorr. RF source power may be applied to maintain a plasma formed from the first process gas. For example, a power of about 100 Watts to about 800 Watts may be applied to an inductively coupled antenna source to maintain the plasma inside the etch chamber. The third gas mixture may be flowed into the chamber at a rate between about 50 sccm to about 1000 sccm. A substrate temperature is maintained within a temperature range of about 20 degrees Celsius to about 500 degrees Celsius.

Figure 4G:
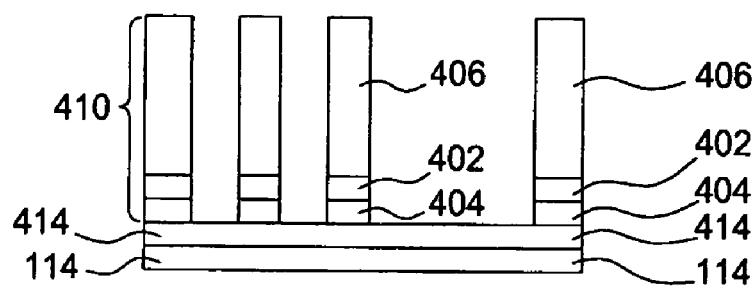

The mask layer 408 may be removed after the film stack 410 has been etched, as shown in FIG. 4G. In an alternative embodiment, the steps 205, 206, 208 may be performed repeatedly to incrementally etch the layer 404 while reopening the patterned mask and maintaining an oxidation layer protecting the sidewalls of the etched feature, as indicated by loop 210, illustrated in FIG. 2.

The method described above may be utilized to etch substrates having different film layers and/or to form different structures. In yet another exemplary embodiment, illustrated in FIGS. 5A-5E, a substrate 114 is etched by using the another embodiment of the method 200 of FIG. 2.

FIGS. 5A-5E are schematic cross-sectional views of a portion of a substrate corresponding to the process 200 for etching a shadow trench isolation (STI) structure. Although the process 200 is illustrated for forming an STI structure in FIGS. 5A-5E, the process 200 may be beneficially utilized to etch other structures.

Figure 5A:
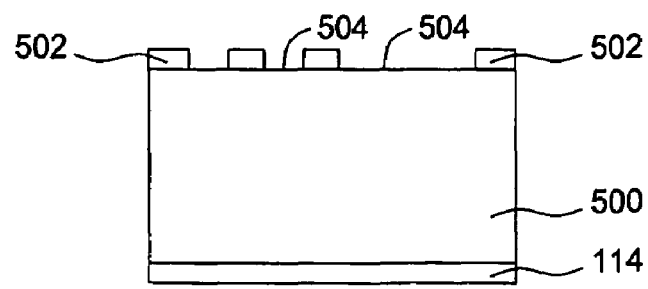
FIGS. 5A-5E are diagrams illustrating a cross-sectional view of a portion of a substrate having a shallow trench isolation (STI) structure.

The method 200 begins at step 202 where a substrate is transferred to an etch process chamber. The substrate 114, as shown in FIG. 5A, contains a layer 500 disposed thereon. In one embodiment, the layer 500 is suitable to fabricate the STI structure. The layer 500 may be a silicon film, e.g., blanket bare silicon film. In embodiments wherein the layer 500 is not present, processes described as performed on the layer 500 may alternatively be on the substrate 114. The substrate 114 may be any semiconductor substrates, such as silicon wafers, glass substrates and the like.

A mask 502 may be a hard mask, photoresist mask, or a combination thereof. The mask 502, used as an etch mask, having openings exposing portions 504 of the layer 500. The substrate 114, with or without the layer 500, may be etched through the openings to remove material from the exposed portions 504 to form features.

Figure 5B:
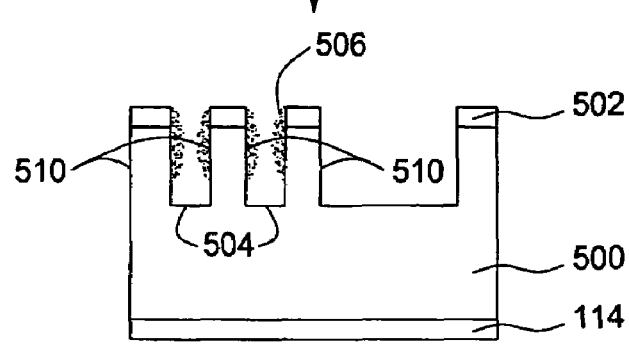

At step 204, a first gas mixture is supplied to the etch chamber to etch the layer 500. In step 204, the portion 504 of the layer 500 is etched, as shown in FIG. 5B, through openings defined by the mask 502 to form a trench in the film layer 500.

In one embodiment, the first gas mixture includes a halogen-containing gas. The halogen-containing gas may be a bromine containing gas, including, but not limited to, at least one hydrogen bromide (HBr), bromine gas ($Br_2$), and the like, and may be accompanied by at least one fluorine-containing gas. In one embodiment, the first gas mixture includes bromine gas ($Br_2$) and nitrogen trifluoride ($NF_3$). In another embodiment, the first gas mixture used in step 204 may further include a silicon containing gas. A suitable silicon containing gas may be tetrafluorosilane ($SiF_4$) gas.

Process parameters may be regulated during step 204. In one embodiment, the chamber pressure in the presence of the first gas mixture inside the etch chamber is regulated between about 2 mTorr to about 100 mTorr, for example, at about 10 mTorr. A substrate bias power may be applied to the substrate support pedestal at a power between about 0 and about 300 Watts. RF source power may be applied to maintain a plasma formed from the first process gas to etch at least a portion of the layer 406. For example, a power of about 200 Watts to about 3000 Watts may be applied to an inductively coupled antenna source to maintain the plasma inside the etch chamber. A substrate temperature is maintained within a temperature range of about 30 degrees Celsius to about 500 degrees Celsius.

At an optional step 205, redeposition layer 506 (shown in FIG. 5B), deposited during the etching step 204, may be removed by providing a cleaning gas to the chamber. The cleaning gas etches the redeposition layer 506 accumulated on the top or sidewall of the mask 502 and the etched layer 500 to reopen the patterned mask.

The cleaning gas used herein may include at least a fluorine-containing gas. In one embodiment, the cleaning gas comprises at least fluorine-containing gas, such as nitrogen trifluoride ($NF_3$), sulfur hexafluoride gas ($SF_6$), tetrafluoromethane gas ($CF_4$) and the like. In another embodiment, the cleaning gas comprises carbon and fluorine containing gas includes $CHF_3$, $C_4F_8$, and the like. The cleaning gas may include an inserting gas, such as argon (Ar), helium (He), and the like.

Figure 5C:
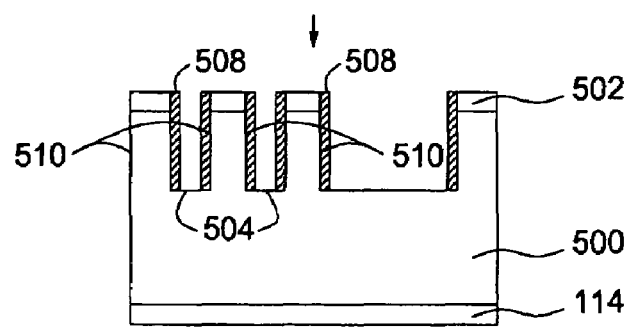

As stated above, insufficient sidewall passivation of the etched layer with high aspect ratio may be observed during the etching process. To provide sufficient protection of the sidewall, an oxidation layer 508 is deposited at step 206. The oxidation layer 508 may be applied by supplying a second gas mixture having an oxygen-containing gas into the etch chamber to form the oxidation layer 508 on sidewalls 510 of the etched layer 500 on the substrate, as shown in FIG. 5C. In one embodiment, the exposed sidewall 510 of the layer 500 reacts with the oxygen gas supplied into the process chamber to form the oxidation layer 508 as a $SiO_2$ layer. The oxidation layer 508 serves as a passivation layer to protect the sidewall 510 of the layer 500 from lateral attack in following etching steps.

The oxidation layer 508 may be formed in various methods. In one embodiment, the oxidation layer 508 may be formed in-situ by supplying at least an oxygen-containing gas, such as $O_2$, $N_2O$, NO, CO and $CO_2$, among others, into the etch chamber to react with the substrate. In another embodiment, the etched layer 500 may be exposed to an environment containing at least an oxygen gas and/or oxygen-containing gas (i.e., by transferring the substrate to a buffer chamber or transferring chamber) to form an oxidation layer thereon. In yet another embodiment, the oxidation layer is formed during transfer between tools by exposure to atmospheric conditions outside the vacuum environment of the tool.

Figure 5D:
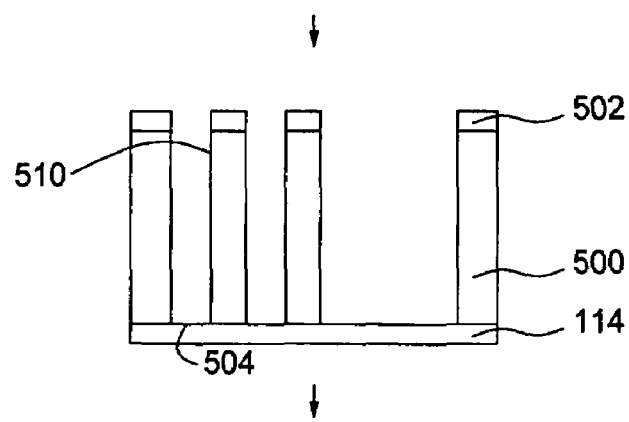

At step 208, a third gas mixture is supplied into the process chamber to etch the remaining portion 504 of the etched layer 500 unprotected by the mask 502, as shown in FIG. 5D. The etching process is substantially vertical. The third gas mixture gas may be any suitable gas used to remove the layer 500. In one embodiment, the third gas mixture may be the same as the first gas mixture in step 204. In one embodiment, the etching process at step 208 may be ended while the layer 500 has been entirely removed.

Figure 5E:
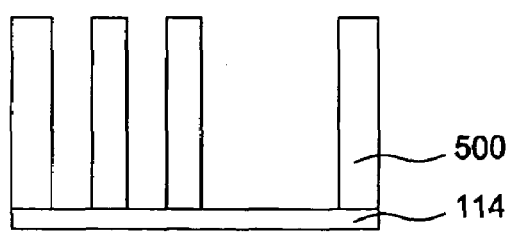

The redeposition layer 506 may be redeposited during the subsequent etching process of step 208, and the oxidation layer 508 may be consumed during the etching process. As such, the steps 205, 206, 208 may optionally be performed cyclically to incrementally etch the layer 500, as indicated by loop 210 illustrated in FIG. 2. Incremental etching with repetitive removal of redeposition layers 506 and/or deposition of oxidation layers 508 improves trench verticality by reopening the patterned mask and maintaining an oxidation layer during the etch feature in the layer 500 while promoting accurate CD transfer. The mask layer may be removed after the layer 500 has been etched into a desired feature, as shown in FIG. 5E.

The third gas mixture gas may be any suitable gas used to remove the layer 500. In one embodiment, the third gas mixture may be the same as the first gas mixture in step 204.

Figure 6:
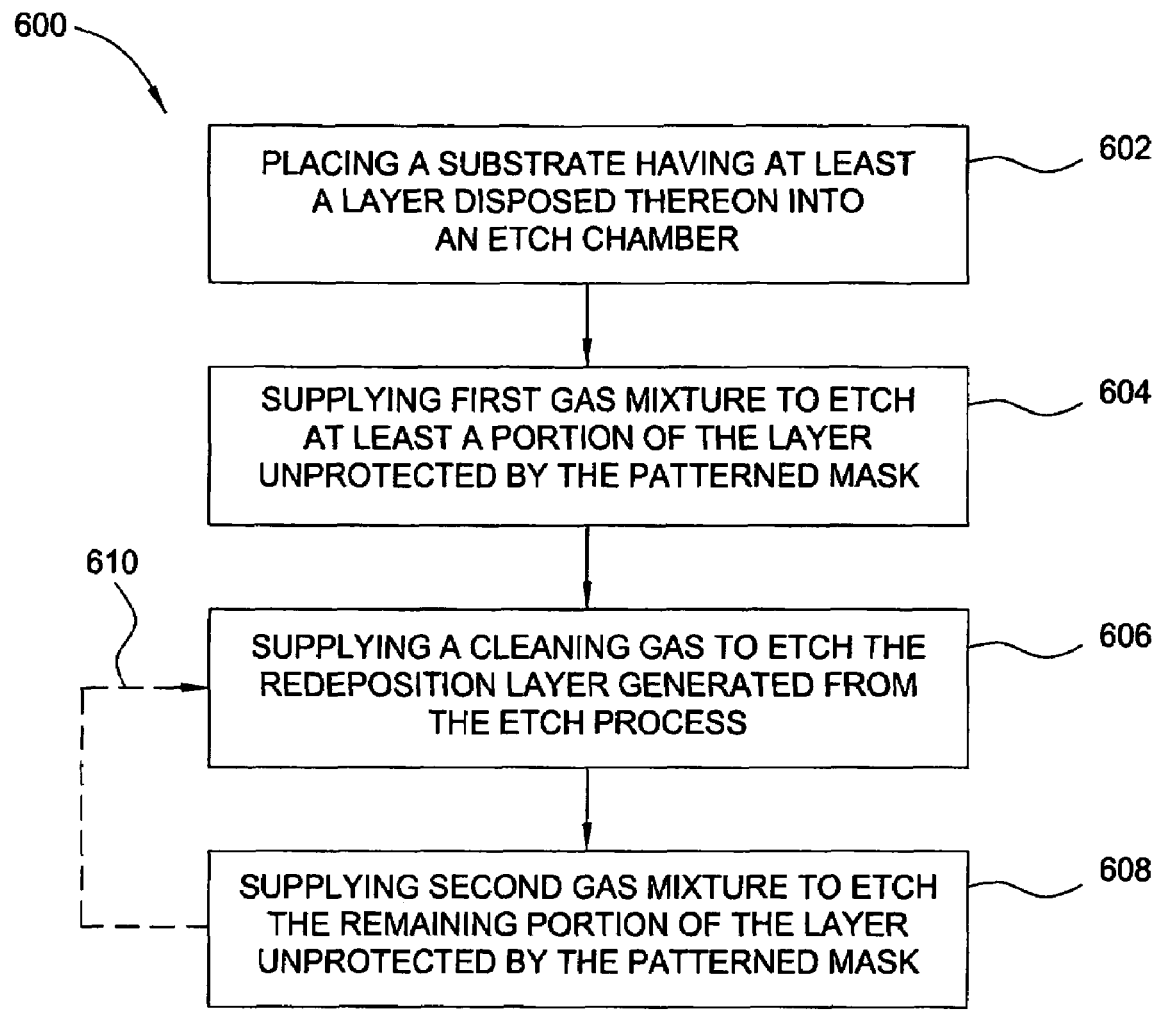
FIG. 6 is a process flow diagram illustrating a method incorporating another embodiment of the invention.

FIG. 6 is a flow diagram of another embodiment of an etch process 600. FIGS. 7A-7D are schematic cross-sectional views of a portion of a substrate corresponding to the process 600 for etching a substrate with high aspect ratio. Although the process 600 is illustrated for forming a high aspect ratio structure in FIGS. 7A-7D, the process 600 may be beneficially utilized to etch other structures.

The process 600 begins at step 602 by transferring a substrate 114 to an etch process chamber. In one embodiment depicted in FIG. 7A, the substrate 114 has a layer 700 suitable for fabricating a high aspect ratio structure. The layer 700 may be any material, such as a dielectric material, a silicon material, metals, metal nitrides, metal alloys, and other conductive materials. The substrate 114 may be any one of semiconductor substrates, silicon wafers, glass substrates and the like. The layers that comprise the layer 700 may be formed using a suitable conventional deposition technique, such as atomic layer deposition (ALD), physical vapor deposition (PVD), chemical vapor deposition (CVD), plasma enhanced CVD (PECVD), and the like.

A mask 702, e.g., a hard mask, photoresist mask, or the combination thereof, may be used as an etch mask exposing portions 704 of the layer 700. The exposed portions 704 of the layer 700 may be etched through openings in the mask 702 to form features, such as high aspect ratio trenches.

Figure 7A:
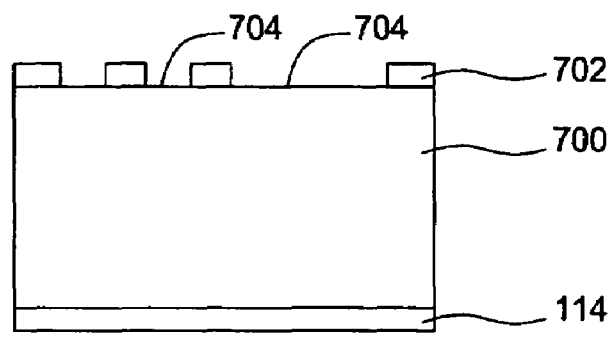
FIGS. 7A-7D are diagrams illustrating a cross-sectional view of a portion of a substrate having a high aspect ratio structure to be formed.
Figure 7B:
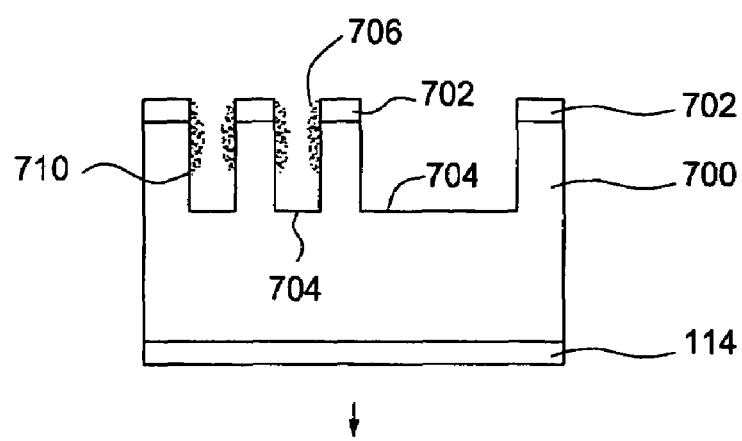

At step 604, a first gas mixture is supplied to the etch chamber to etch the layer 700, as shown in FIG. 7B. In step 604, a portion 704 of the layer 700 is etched through openings defined by the mask 702 to form a trench in the film layer 700.

At step 606, a cleaning gas may be utilized to etch a redeposition layer 706 generated during the etching step 604. The mask layer 702 or the etched layer 700, when attacked during step 604, release reactants, such as silicon and carbon containing elements, within the etch chamber. The reactants may condense and accumulate on the sidewall and/or top of the mask layer 702 and etched layer 700, thereby forming the redeposition layer 706, as shown in FIG. 7B. As the redeposition layer 706 accumulates, the opening portion 704 of the trench may be narrowed and/or closed, thereby disrupting the etching process. As such, a cleaning gas is supplied into the etch chamber to etch the polymer redeposition layer 706 to reopen the patterned mask.

The cleaning gas may include at least one fluorine-containing gas. In one embodiment, the cleaning gas comprises at least fluorine-containing gas, such as nitrogen trifluoride ($NF_3$), sulfur hexafluoride gas ($SF_6$), tetrafluoromethane gas ($CF_4$) and the like. In another embodiment, the cleaning gas comprises carbon and fluorine containing gas includes $CHF_3$, $C_4F_8$, and the like. An inserting gas, such as argon (Ar), helium (He), and the like, may be contained in the cleaning gas.

Figure 7C:
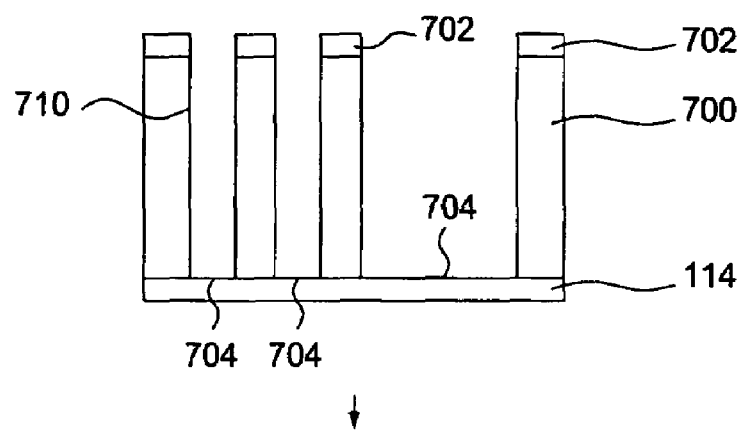

At step 608, a second gas mixture is supplied into the process chamber to etch the remaining portion 704 of the etched layer 700 unprotected by the mask 702, as shown in FIG. 7C. The etching process is substantially vertical. The second gas mixture gas may be any suitable gas used to remove the layer 700. In one embodiment, the second gas mixture may be the same as the first gas mixture in step 604. In one embodiment, the etching process at step 608 may be ended while the layer 700 has been entirely removed.

Figure 7D:
Figure 8A:
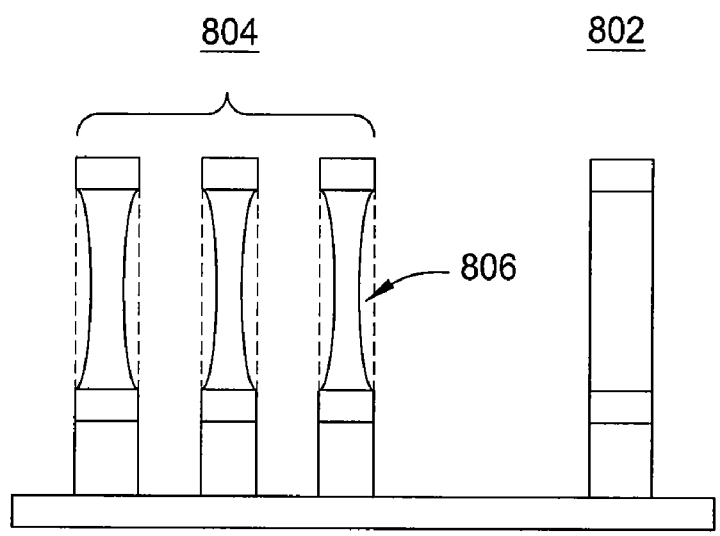
FIG. 8A-8B are illustrating cross-sectional views of embodiments of prior arts of features with high aspect ratios being etched with poor dimensional control.
Figure 8B:
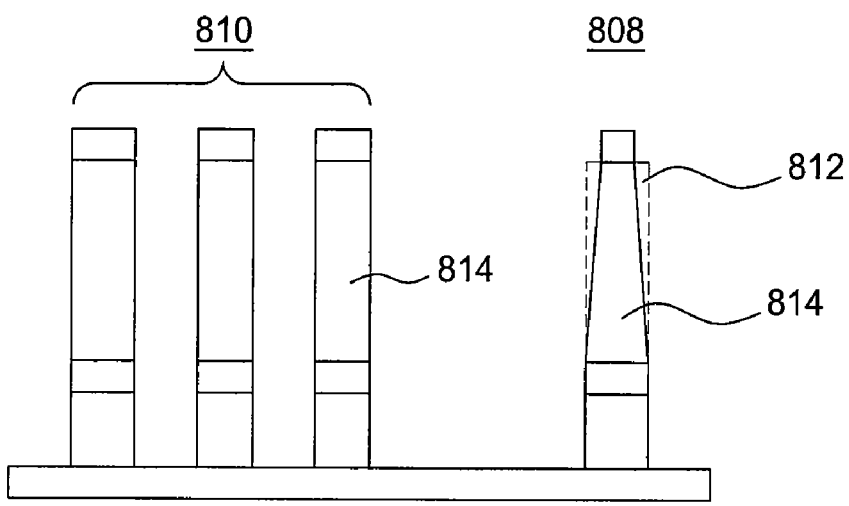
Figure 9:
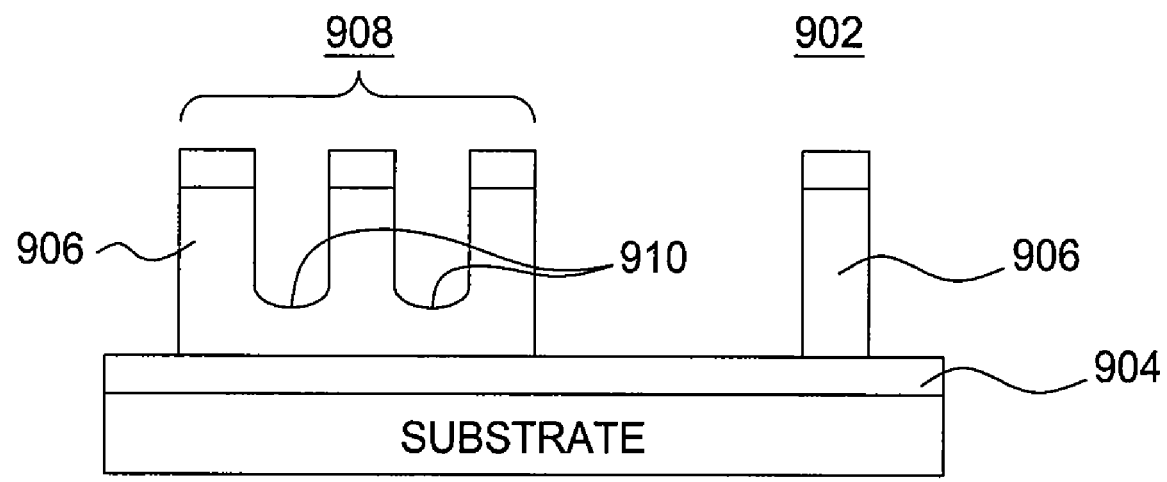
FIG. 9 is illustrating cross-sectional view of one embodiment of prior arts of features with high aspect ratios in multiple layers.

The redeposition layer 706 may be redeposited during the subsequent etching process of step 608. As such, the steps 606, 608 may optionally be performed repeatedly to cyclically etch the layer 700, as indicated by loop 610 illustrated in FIG. 6. Incremental etching with repetitive removal of the redeposition layer 706 improves verticality while etching high aspect ratio by reopening the patterned mask during the etch feature in the layer 700 while providing accurate CD transfer. The mask layer 702 may be alternatively removed after the layer 700 has been etched into a desired feature, as shown in FIG. 7D.

Thus, the present application provides an improved method for etching a substrate. The method advantageously facilitates profile and dimension control while etching by selectively forming a protective oxidation layer and/or removing the redeposition layer generated during etching.

While the foregoing is directed to embodiments of the present invention, other and further embodiments of the invention may be devised without departing from the basic scope thereof, and the scope thereof is determined by the claims that follow.

What is claimed is:

1. A method for anisotropic etching a layer on a substrate, comprising:
   (a) placing a substrate having a layer disposed thereon in an etch chamber;
   (b) etching at least a portion of the layer on the substrate in the etch chamber;
   (c) oxidizing the etched layer to form an oxidation layer on the etched layer;
   (d) forming the oxidation layer preferentially in a first group of features having a low pattern density over a second group of features having a high pattern density; and
   (e) etching the remaining portion of the etched layer unprotected by the oxidation layer in the etch chamber.

2. The method of claim 1, wherein etching at least a portion of the layer further comprising:
   repeating (c)-(e) to incrementally etch the layer.

3. The method of claim 1 further comprising;
   cyclically etching byproducts disposed on a patterned mask layer disposed on the layer to reopen openings defined by the patterned mask layer.

4. The method of claim 1, wherein forming an oxidation layer further comprises:
   forming the oxidation layer on a sidewall formed in the etched layer.

5. The method of claim 1, wherein forming an oxidation layer further comprises:
   supplying an oxygen-containing gas into the etch chamber.

6. The method of claim 1, wherein forming an oxidation layer further comprises:
   exposing the substrate to an oxygen-containing environment.

7. The method of claim 1 further comprising:
   etching a redeposition layer formed from etching byproducts during (b) using a fluorine-containing gas.

8. The method of claim 7, wherein the fluorine-containing gas includes at least one of nitrogen trifluoride gas ($NF_3$), sulfur hexafluoride gas ($SF_6$), or tetrafluoromethane gas ($CF_4$), $CHF_3$, and $C_4F_8$.

9. A method for an isotropic etching a layer on a, comprising:
   (a) placing a substrate having a film stack comprising a first layer and a second layer in an etch chamber;
   (b) etching the film stack having openings defined by a patterned mask layer on the substrate to expose the first and the second layer in the etch chamber;
   (c) oxidizing the first layer to form an oxidation layer on the etched first layer;
   (d) preferentially forming the oxidation layer in regions of low patterned density over regions of high pattern density; and
   (e) etching the second layer in the etch chamber.

10. The method of claim 9, wherein etching the film stack to expose the first and second layer further comprising:
    etching the first layer;
    forming an oxidation layer on the first layer; and
    etching the first layer to expose the second layer.

11. The method of claim 9 further comprising:
    repeating (c)-(e) to incrementally etch the second layer.

12. The method of claim 9, wherein the first layer is a polysilicon layer.

13. The method of claim 9, wherein the oxidation layer is formed on a sidewall of the first layer.

14. The method of claim 9, further comprising:
    oxidizing a portion of the etched second layer to form an oxidation layer thereon prior to completing etching of the first layer.

15. The method of claim 9 wherein the second layer is a high-k material.

16. The method of claim 15, wherein the high-k material is a material selected from the group consisting of hafnium dioxide, zirconium dioxide, hafnium silicon oxide, zirconium silicon oxide, tantalum dioxide, aluminum oxide, aluminum doped hafnium dioxide, and combinations thereof.

17. The method of claim 9, wherein etching the film stack to expose the first and second layer further comprising:
    flowing a fluorine-containing gas into the chamber; and
    etching a redeposition layer formed from etching byproducts during etching the first layer.

18. The method of claim 17, wherein etching a redeposition layer further comprises:
    etching the redeposition layer with a fluorine-containing gas.

19. The method of claim 17 further comprising:
    cyclically removing the redeposition layer to maintain the opening defined in the patterned mask layer.

20. The method of claim 19 wherein the second layer is a dielectric layer including an oxide layer, a nitrogen layer, a composite of oxide and nitrogen layer, and at least one or more oxide layers sandwiching a nitrogen layer.

* * * * *

UNITED STATES PATENT AND TRADEMARK OFFICE
CERTIFICATE OF CORRECTION

PATENT NO. : 7,368,394 B2
APPLICATION NO. : 11/363834
DATED : May 6, 2008
INVENTOR(S) : Shen et al.

It is certified that error appears in the above-identified patent and that said Letters Patent is hereby corrected as shown below:

Column 4, Line 56, please delete "1146" and insert --116--;

Column 15, Claim 8, Line 42, please delete "($NE_3$)" and insert --($NF_3$)--;

Column 15, Claim 9, Line 45, please delete "an isotropic" and insert --anisotropic--.

Signed and Sealed this

Sixteenth Day of September, 2008

JON W. DUDAS
*Director of the United States Patent and Trademark Office*